United States Patent
Yu

(10) Patent No.: US 9,037,776 B2
(45) Date of Patent: May 19, 2015

(54) STORAGE DEVICE WITH FLASH MEMORY AND DATA STORAGE METHOD

(75) Inventor: Bum-seok Yu, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 874 days.

(21) Appl. No.: 12/780,980

(22) Filed: May 17, 2010

(65) Prior Publication Data

US 2010/0318879 A1 Dec. 16, 2010

(30) Foreign Application Priority Data

Jun. 11, 2009 (KR) .................. 10-2009-0051951

(51) Int. Cl.
| | | |
|---|---|---|
| *G06F 12/00* | (2006.01) | |
| *G06F 12/08* | (2006.01) | |
| *G06F 3/06* | (2006.01) | |
| *G06F 11/10* | (2006.01) | |
| *G06F 12/02* | (2006.01) | |
| *H03M 13/09* | (2006.01) | |

(52) U.S. Cl.
CPC .......... *G06F 12/0873* (2013.01); *G06F 3/0616* (2013.01); *G06F 11/1004* (2013.01); *G06F 12/0246* (2013.01); *G06F 2212/7201* (2013.01); *H03M 13/09* (2013.01); *H03M 13/096* (2013.01); *H03M 13/098* (2013.01)

(58) Field of Classification Search
None
See application file for complete search history.

(56) References Cited

U.S. PATENT DOCUMENTS

| | | | | |
|---|---|---|---|---|
| 5,958,079 | A * | 9/1999 | Yoshimura | 714/766 |
| 6,601,211 | B1 * | 7/2003 | Norman | 714/773 |
| 7,496,710 | B1 * | 2/2009 | Venkatrao | 711/117 |
| 7,568,082 | B2 * | 7/2009 | Hoogerbrugge | 711/170 |
| 2004/0024971 | A1 * | 2/2004 | Bogin et al. | 711/135 |
| 2004/0186946 | A1 * | 9/2004 | Lee | 711/103 |
| 2007/0214309 | A1 * | 9/2007 | Matsuura et al. | 711/103 |
| 2008/0082744 | A1 * | 4/2008 | Nakagawa | 711/113 |
| 2008/0320214 | A1 * | 12/2008 | Ma et al. | 711/103 |
| 2010/0023682 | A1 * | 1/2010 | Lee et al. | 711/103 |

FOREIGN PATENT DOCUMENTS

| | | |
|---|---|---|
| JP | 2003256266 A | 9/2003 |
| JP | 2007034431 A | 2/2007 |
| JP | 2007199985 A | 8/2007 |

* cited by examiner

*Primary Examiner* — Kaushikkumar Patel
(74) *Attorney, Agent, or Firm* — Volentine & Whitt, PLLC

(57) ABSTRACT

A method of storing write data in flash memory incorporated in a storage device, the method includes; receiving write data and a logical block address (LBA) for the flash memory, determining whether the LBA exists in the cache memory, if the LBA exists in the cache memory, comparing the write data with cache data stored in the cache memory at a location associated with the LBA, and if the write data and the cache data are the same, terminating operation of the storage device without programming the write data to the flash memory, else updating an error detection information lookup table entry associated with the LBA and programming the write data to the flash memory, and if the LBA does not exist in the cache memory, updating the error detection information lookup table entry associated with the LBA and programming the write data to the flash memory.

5 Claims, 7 Drawing Sheets

FIG. 3

CRC LOOKUP TABLE

|   | LBA   | CRC   |
|---|-------|-------|
| 0 | LBA3  | CRC3  |
| 1 | LBA10 | CRC10 |
| 2 | LBA1  | CRC1  |
| ⋮ | ⋮     | ⋮     |

STORAGE DEVICE WITH FLASH MEMORY AND DATA STORAGE METHOD

CROSS-REFERENCE TO RELATED APPLICATIONS

This application claims the benefit of Korean Patent Application No. 10-2009-0051951 filed on Jun. 11, 2009, the subject matter of which is hereby incorporated by reference.

BACKGROUND

The inventive concept relates to storage devices including flash memory, and methods of storing data. More particularly, the inventive concept relates to storage devices including flash memory capable of increasing the lifespan of the flash memory by filtering data to be stored in the flash memory, and related methods of storing data.

Flash memory is a particular form of non-volatile memory and is capable of retaining stored data in the absence of applied power. Due to its high integration density and fast operating speed, flash memory is commonly used in mobile devices such as cellular phones, personal digital assistants (PDAs), digital cameras, portable game consoles, and MP3 players to store programming code and user (or payload) data. In addition, the flash memory is increasingly used in such consumer electronics as high definition (HD) TVs, digital versatile displays (DVDs), routers, and global positioning systems (GPSs).

SUMMARY

Embodiments of the inventive concept provide a storage device including a flash memory having an improved write endurance characteristic. Embodiments of the inventive concept also provide methods of storing data in a storage device.

According to an aspect of the inventive concept, there is provided a method of storing data in a storage device including a flash memory, the method including: receiving data which is to be stored in the flash memory and a logical block address (LBA) of the flash memory in which the data will be stored from a host; determining whether the LBA exists in a cache memory of the storage device; if the LBA exists in the cache memory of the storage device, comparing first error detection information corresponding to the data transmitted from the host with second error detection information of data corresponding to the LBA and stored in the cache memory; if the first error detection information and the second error detection information are the same as each other, comparing the data transmitted from the host with the data stored in the cache memory; and if the data transmitted from the host and the data stored in the cache memory are the same as each other, omitting an operation of storing the data transmitted from the host in the flash memory.

If the LBA does not exist in the cache memory of the storage device, the method may further include: reading data corresponding to the LBA from the flash memory; and writing the data read from the flash memory in the cache memory.

If the first error detection information and the second error detection information are not the same as each other or the data transmitted from the host and the data stored in the cache memory are not the same as each other, the method may further include storing the data transmitted from the host in the flash memory.

If the LBA does not exist in the cache memory of the storage device, the method may further include storing the data transmitted from the host in the flash memory.

The first error detection information and second error detection information may be generated by at least one selected from the group consisting of a cycle redundancy check (CRC) method, a parity method, and a checksum method.

The storage device may be a solid-state drive (SSD).

According to another aspect of the present inventive concept, there is provided a method of storing data in a storage device including a flash memory, the method including: receiving data which is to be stored in the flash memory and a logical block address (LBA) of the flash memory in which the data will be stored from a host; determining whether the LBA exists in a cache memory of the storage device; if the LBA exists in the cache memory of the storage device, comparing the data transmitted from the host with the data stored in the cache memory with respect to the LBA; and if the data transmitted from the host and the data stored in the cache memory are the same as each other, omitting an operation of storing the data transmitted from the host in the flash memory.

According to another aspect of the present inventive concept, there is provided a storage device including: a flash memory; a cache memory; an interface unit receiving a write command including data to be stored in the flash memory and an LBA of the flash memory, to which the data to be stored, from a host; and a controller comparing first error detection information corresponding to the data transmitted from the host with second error detection information of data corresponding to the LBA and stored in the cache memory or comparing the data included in the write command with the data stored in the cache memory to determine whether the data included in the write command is stored in the flash memory, if the LBA included in the write command exists in the cache memory.

The controller may not store the data included in the write command in the flash memory if the LBA included in the write command does not exist in the cache memory, the first error detection information and the second error detection information are different from each other or the data included in the write command and the data stored in the cache memory are different from each other.

BRIEF DESCRIPTION OF THE DRAWINGS

Exemplary embodiments of the inventive concept will be more clearly understood from the following detailed description taken in conjunction with the accompanying drawings in which:

FIG. 3 is one possible example of an error detection information lookup table;

DETAILED DESCRIPTION OF THE EMBODIMENTS

The attached drawings illustrate certain selected embodiments of the present inventive concept and may be referred to in order to gain an understanding of the inventive concept, the merits thereof, and the objectives accomplished by implementation of the inventive concept.

Hereinafter, the inventive concept will be described in some additional detail with reference to the attached drawings. Throughout the drawings and written description, like reference numbers and labels denote like or similar elements.

Flash memories included in a solid-state drive (SSD) may be classified as single-level cell (SLC) flash memories and multi-level cell (MLC) flash memories. MLC flash memory has a lifespan that is about 1/10 of the lifespan of SLC flash memory. To a great extent, the lifespan of flash memory is a function of its "write endurance" (or its ability to be repeated programmed or erased over time).

Thus, the write endurance of MLC flash memory is much inferior to that of SLC flash memory. Moreover, the write endurance of a flash memory affects the reliability of the device including the flash memory. Therefore, the influence of the write endurance of the flash memory on the lifespan or the reliability of the storage memory that includes the flash memory such as the SSD increases.

Figure 1:
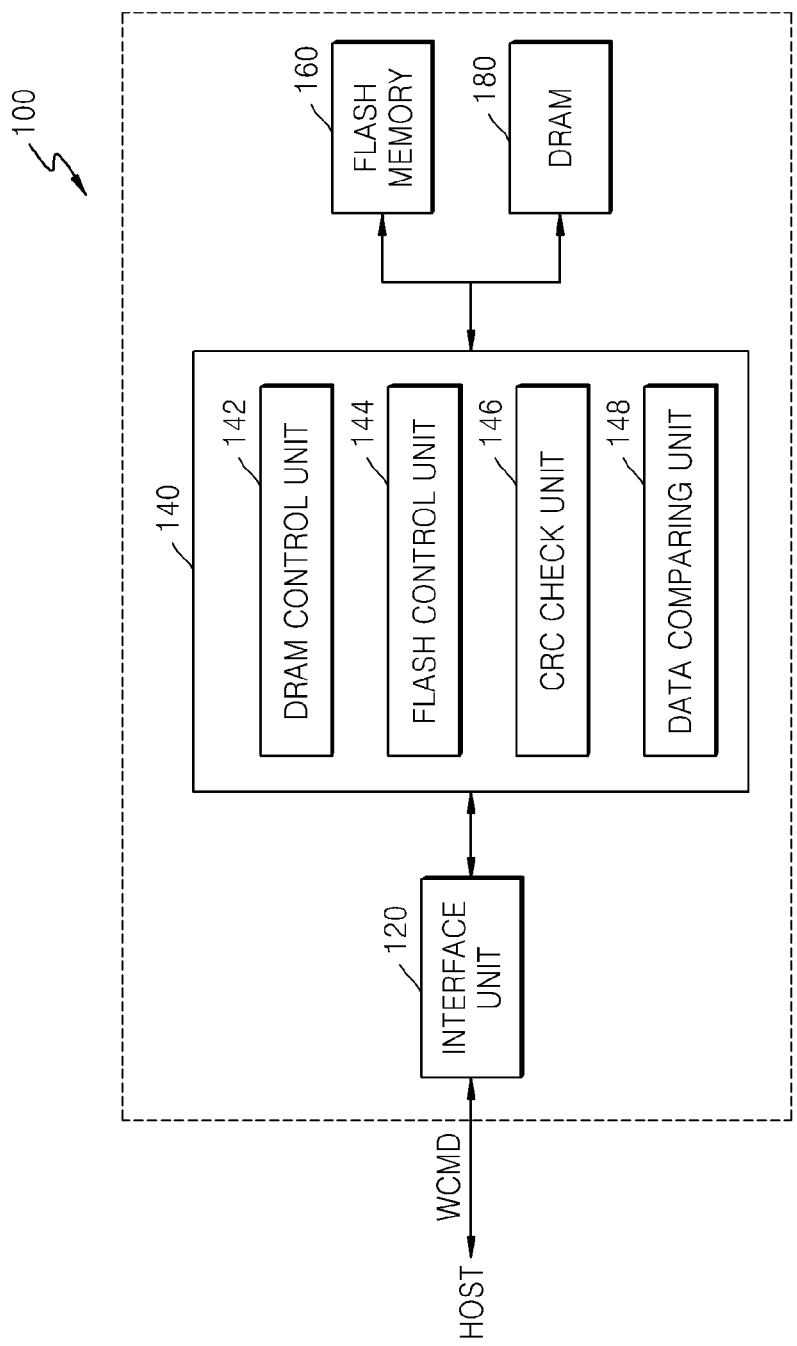
FIG. 1 is a block diagram of a storage device according to an embodiment of the inventive concept.

Figure (FIG. 1 is a block diagram of a storage device 100 according to an embodiment of the inventive concept.

Referring to FIG. 1, the storage device 100 comprises a flash memory 160, a cache memory 180, a controller 140, and an interface unit 120. The storage device 100 is configured to receive a write command WCMD from a host, and store data included in the write command WCMD in the flash memory 160.

The cache memory 180 may be implemented using dynamic random access memory (DRAM), static random access memory (SRAM), or some form of non-volatile memory. Hereinafter, the illustrated embodiment of FIG. 1 assumes the use of DRAM in the implementation of the cache memory 180. Further, the storage device 100 illustrated in FIG. 1 is assumed to be a SSD, and the flash memory 160 is assumed to be MLC flash memory. These assumptions are all merely convenient examples of possible design choices for embodiments of the inventive concept.

The externally located host may be a central processing unit (CPU) of a computer, and the storage device 100 and the host may be conventionally connected via one or more bus structures (not shown). In addition, the write command WCMD may include "write data" (i.e., data to be stored in the flash memory 160) and a logical block address (LBA) associated with the write data and indicating a memory location within the flash memory 160. This will be described in some additional detail hereafter.

In the illustrated embodiment, the controller 140 comprises a cache memory controller 142 (hereinafter referred to as 'DRAM controller 142'), a flash memory controller 144, an error detection information check unit 146 (hereinafter referred to as 'CRC check unit 146'), and a data comparator 148. These elements of the controller 140 will be described in some additional detail hereafter.

Figure 2:
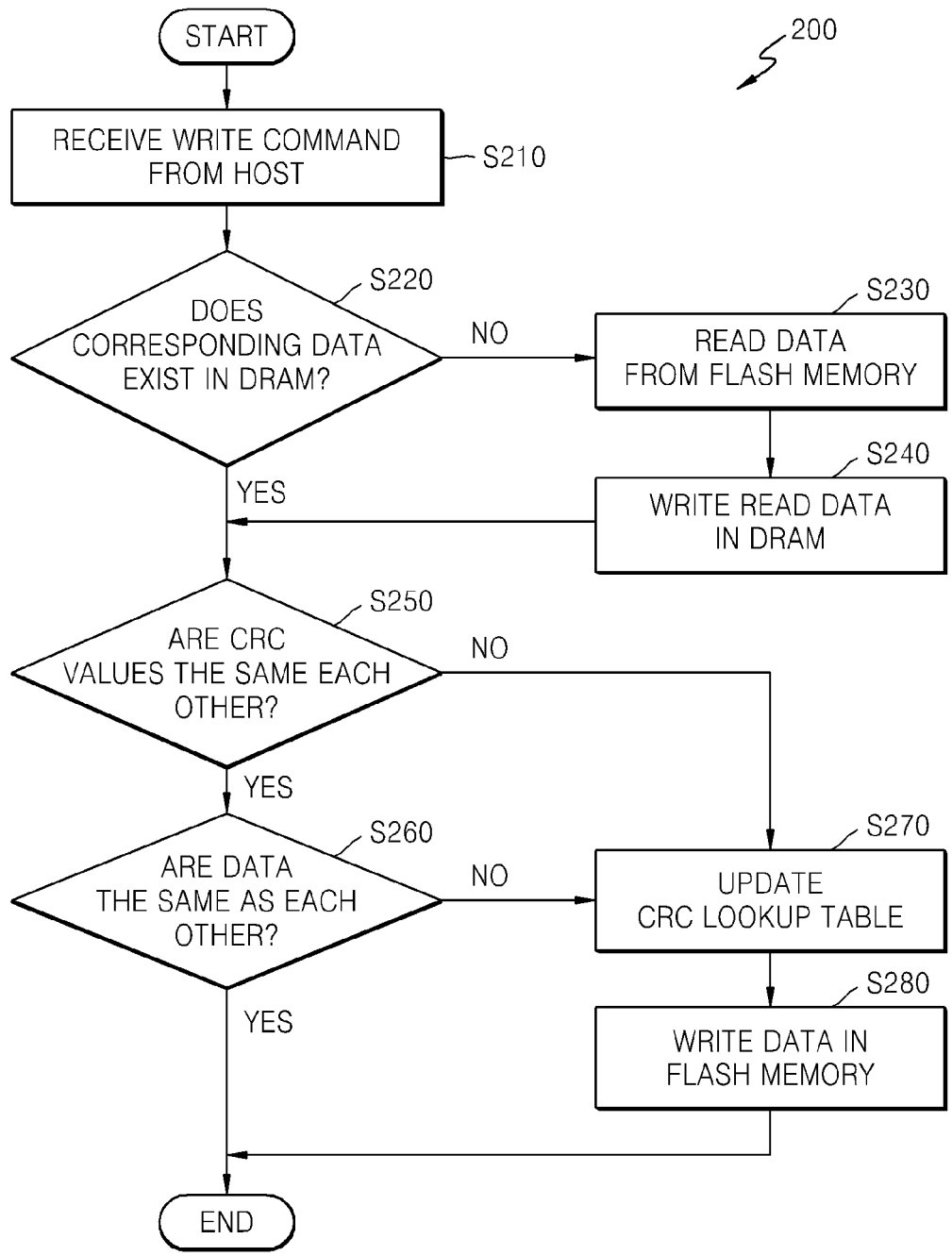
FIG. 2 is a flowchart summarizing a data storing method for the storage device of FIG. 1 according to an embodiment of the inventive concept.

FIG. 2 is a flowchart summarizing a data storing method 200 for the storage device 100 of FIG. 1 according to an embodiment of the present inventive concept.

Referring to FIGS. 1 and 2, according to the storage device 100 and the data storing method 200, the following exemplary operations may be performed to determine whether the write data included in the write command WCMD is "equal to" (i.e., is logically identical to) the data stored in the flash memory 160 with respect to the LBA included in the write command WCMD.

According to the data storing method 200, the write command WCMD, which is transmitted from the host to control the operation of storing associated write data in the flash memory 160, is received through the interface unit 120 (S210). When the write command WCMD is received from the host, the DRAM controller 142 determines whether the write data included in the received write command WCMD exists in the cache memory (DRAM) 180 (S220).

For example, the DRAM controller 142 may determine whether the write data included in the received write command WCMD exists in the DRAM (cache memory) 180 by determining whether the LBA included in the received write command WCMD exists in the DRAM 180.

If the LBA included in the write command SCMD does not exist in the DRAM 180, the flash memory controller 144 may read the data that is stored in the flash memory 160 at the location indicated by the LBA (S230). The data read from the flash memory 160 may then be written to the DRAM 180 (S240).

On the other hand, if the LBA included in the write command WCMD exists in the DRAM 180, the CRC check unit 146 compares error detection information (e.g., a CRC value) associated with write data with error detection information associated with the corresponding data stored in the DRAM 180 (i.e., the stored data located at the LBA is compared with the write data provided with the write command WCMD) (S250).

When the controller 140 receives the write data from the host, its will generate corresponding error detection information. The cache memory 180 may be used to store the error detection information for data stored at a certain location. For example, the cache memory 180 may store the error detection information corresponding to designated sectors of the data. Hereinafter, the error detection information associated with the write data received from the host will be termed "first error detection information", and the error detection information associated with the data stored in the DRAM 180 will be termed "second error detection information."

Error detection information indicates whether an error exists in a certain bit of the transmitted (processed) data in order to ensure the reliability of the data when the data is transmitted (or processed). Many different and conventionally understood error detection methods may be used alone or in combination, such as cycle redundancy check (CRC), parity check, and checksum algorithms, etc.

Hereinafter, it will be assumed that the error detection information used in the illustrated embodiments is generated using a conventionally understood CRC method. However, the inventive concept is not limited to only the use of CRC methods, and other types of error detection information may be generated using other error detection methods.

The CRC method determines a CRC value for determining whether or not there is an error in the write data transmitted from the host. The CRC value may be calculated by division of commutative ring, and approach well understood by those skilled in the art.

The CRC check unit 146 of the controller 140 calculates a first CRC value (i.e., first error detection information) form the received write data. In addition, the CRC check unit 146 may then compare the first CRC value with a second CRC value (i.e., second error detection information) calculated for the corresponding data stored in the DRAM 180 (S250).

If it is determined by the DRAM controller 142 that the LBA exists in the DRAM 180 (S220), the data stored in the DRAM 180 is data stored with respect to the corresponding LBA. Otherwise, if it is determined by the DRAM controller 142 that the LBA does not exist in the DRAM 180 (S220), the data stored in the DRAM 180 will be data read from the flash memory 160 and then written to the DRAM 180 (S240).

As a result of the comparison, if the first CRC value and the second CRC value are different from each other (S250=NO), the write data included in the write command WCMD and the "DRAM stored data" written to the DRAM 180 may be different from each other. In this case, the controller 140 performs operations 5270 and 5280, which will be described later. However, if the first CRC value and the second CRC value are the same (S250=YES), the data comparator 148 of the controller 140 then compares the write data included in the write command WCMD with the DRAM stored data (or "cache data") (S260).

If the write data included in the write command WCMD and the DRAM stored data (i.e., the data stored in the cache memory 180) are equal (S260=YES), an additional programming (or "write") operation for the flash memory 160 need not be performed (END) because the current write data is the same as the data stored at the location indicated by the corresponding LBA of the flash memory 160 and in the write command WCMD and to be stored in the LBA, is stored in the DRAM 180.

At this time, the controller 140 may inform the host that the data storing operation is completed.

As described above, according to the data storing method 200 of FIG. 2, it is determined whether write data included in the write command WCMD is equal to the data already stored in the flash memory 160 according to a corresponding LBA for the write data.

If the write data and the data stored in the flash memory 160 are different from each other, that is, if the first CRC value and the second CRC value are different (S250=NO), the flash memory controller 144 of the controller 140 writes the write data to the flash memory 160 (S280). If the write data and the data stored in the cache memory 180 are different from each other (S260=NO), the flash memory controller 144 also writes the write data to the flash memory 160.

Here, the flash memory controller 144 of the controller 140 may update a lookup table (S270) correlating the error detection information with LBA before writing the write data to the flash memory 160 (S280). Thus, the error detection information lookup table may include the error detection information for each data sector defined by a corresponding LBA. As described above, when the first error detection information and the second error detection information are respectively the first CRC value and the second CRC value generated by the CRC method, the error detection information lookup table may be a CRC lookup table. Hereinafter, the CRC lookup table will be described for the convenience of explanation.

That is on the illustrated embodiment of FIG. 1, the flash memory controller 144 of the controller 140 is assumed to include a CRC lookup table containing CRC values of for the data stored in the flash memory 160. However, the inventive concept is not limited to only this type of data structure and location, and a competent error detection information data structure may be otherwise provided separate form the flash memory controller 144.

As shown in FIG. 3, an exemplary CRC lookup table may include CRC values for the data (or data pages) identified by corresponding LBAs in the flash memory 160. That is, the CRC values for data (or pages) corresponding to the LBAs in the flash memory 160 may be stored in the CRC lookup table.

Here, updating of the CRC lookup table includes updating a CRC value for a corresponding LBA when data is written to the flash memory 160 (S280).

For example, the CRC value (CRC10) with respect to the LBA10 stored in index 1 of the CRC lookup table shown in FIG. 3 may be changed to the CRC value (CRC10') of the data which will be stored in the flash memory 160. Otherwise, a CRC value (CRC0) of a new LBA (LBA0) may be written in the index 3 of the CRC lookup table.

Referring to FIGS. 1 and 2, when the update of the CRC lookup table is completed (S270), the write data included in the write command WCMD may be stored in a region of the flash memory 160 corresponding to the LBA included in the write command WCMD.

As described above with reference to the storage device 100 and the data storing method 200 according certain embodiments of the inventive concept, the write data received from the host is filtered in order to avoid performing a programming operation for the write data when it is already similarly stored in the flash memory 160. Using this write data filtering approach, the number of data programming operations directed to the flash memory 160 may be reduced, and the write endurance of the flash memory 160 may be extended. As described above, if the write endurance of the flash memory 160 is improved, the reliability of the storage device 100 including the flash memory 160 and the lifespan of the storage device 100 may be increased.

Figure 4:
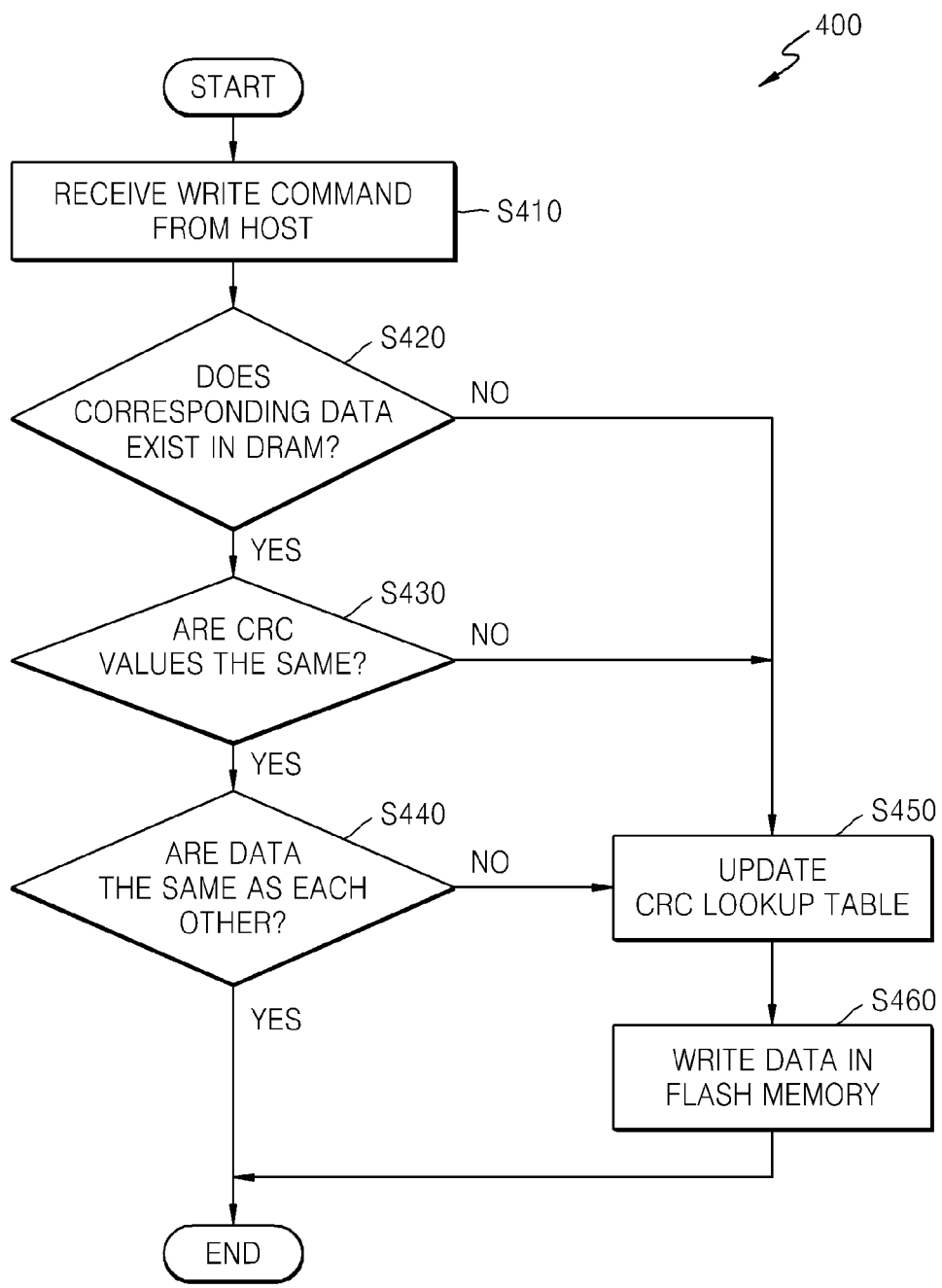
FIG. 4 is a flowchart summarizing a data storing method for the storage device of FIG. 1 according to another embodiment of the inventive concept.

FIG. 4 is a flowchart summarizing a data storing method for the storage device 100 of FIG. 1 according to another embodiment of the present inventive concept.

Referring to FIGS. 1 and 4, a data storing method 400 begins when write command WCMD is received from a host including write data to be stored in the flash memory 160 (S410). When the write command WCMD is received from the host, it is determined whether the LBA included in the write command WCMD already exists within the DRAM 180 (S420).

If the LBA included in the write command WCMD exists in the DRAM 180 (S420=YES), a first CRC value and a second CRC value may be compared with each other (S430), as before.

If the LBA included in the write command WCMD exists in the DRAM 180 (S420=YES), the data storing method 400 may proceed exactly as described above with respect to the data storing method 200 illustrated in FIG. 2. For example, the first CRC value and the second CRC value may be compared (S430), the write data included in the write command WCMD may be compared with data stored in the DRAM 180 (S440), and then, the write data included in the write command WCMD may be written in the flash memory 160 (S440=NO and S460), or not (S440=YES), according to the comparison result.

On the other hand, if the LBA included in the write command WCMD does not exist in the DRAM 180 (S420=NO), the data is not read from the flash memory 160 as before, but the write data included in the write command WCMD is written in the flash memory 160 (S460). In either event noted above, before programming the write data to the flash memory 160 (S460), the CRC lookup table will be updated (S450) as described above, for example.

Figure 5:
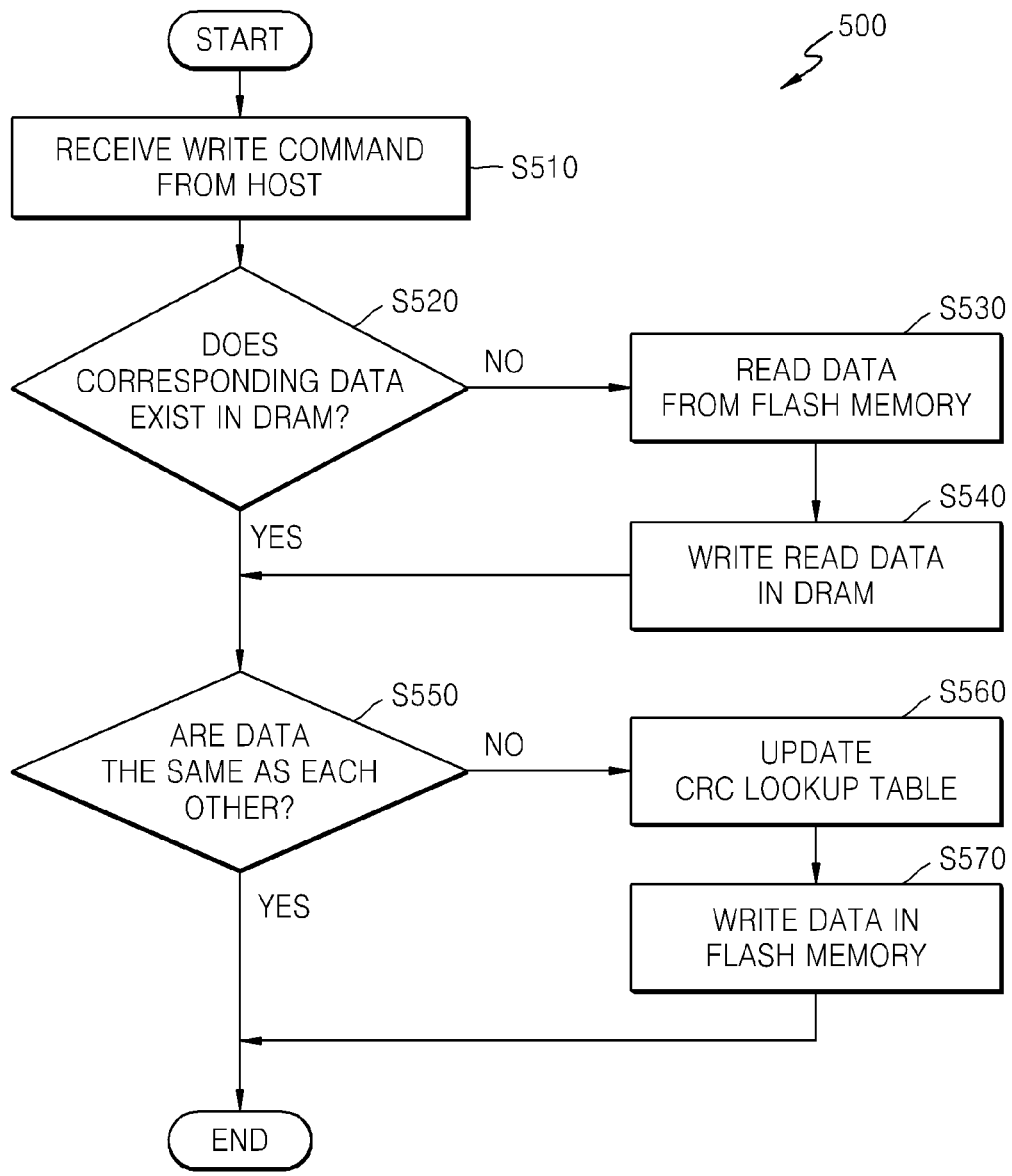
FIG. 5 is a flowchart summarizing a data storing method for the storage device of FIG. 1 according to yet another embodiment of the inventive concept.

FIG. 5 is a flowchart summarizing a data storing method 500 for the storage device 100 of FIG. 1 according to another embodiment of the inventive concept.

Referring to FIGS. 1 and 5, according to the data storing method 500 operating with respect to the storage device 100 of FIG. 1, a write command WCMD is received from the host including write data to be stored in the flash memory 160 (S510).

When the write command WCMD is received from the host, the DRAM controller 142 of the controller 140 determines whether the write data included in the write command WCMD already exists in the DRAM 180 (S520). As described above, this determination may be performed by determining whether the LBA included in the write command WCMD already exists in the DRAM 180.

If the LBA included in the write command WCMD does not exist in the DRAM 180 (S520=NO), the flash controller 144 of the controller 140 may read data stored in the flash memory 160 from a location corresponding to the LBA provided with the write command (S530). The data read from the flash memory 160 may then be written to the DRAM 180 (S540).

On the other hand, if the LBA included in the write command WCMD already exists in the DRAM 180 (S520=YES), unlike the data storing method 200 illustrated in FIG. 2 in which the first CRC value and the second CRC value are compared and then the data included in the write command WCMD and the data stored in the DRAM 180 are compared, the step of comparing the CRC values is not performed in the data storing method 500. Instead, the write data included in the write command WCMD and the data stored in the DRAM 180 are directly compared with each other (S550) in each instance.

If the write data included in the write command WCMD and the data stored in the DRAM 180 are the same (S550=YES), the programming operation otherwise arising from the current write command is avoided for the flash memory 160, since the data stored in the DRAM 180 is the same as the write data included in the write command WCMD and to be stored in the corresponding LBA, is already stored in the DRAM 180.

On the other hand, if the write data included in the write command WCMD and the data stored in the DRAM 180 are different (S550=0N), the write data is programmed to the flash memory 160 (S570), after the CRC lookup table is updated (S560).

Figure 6:
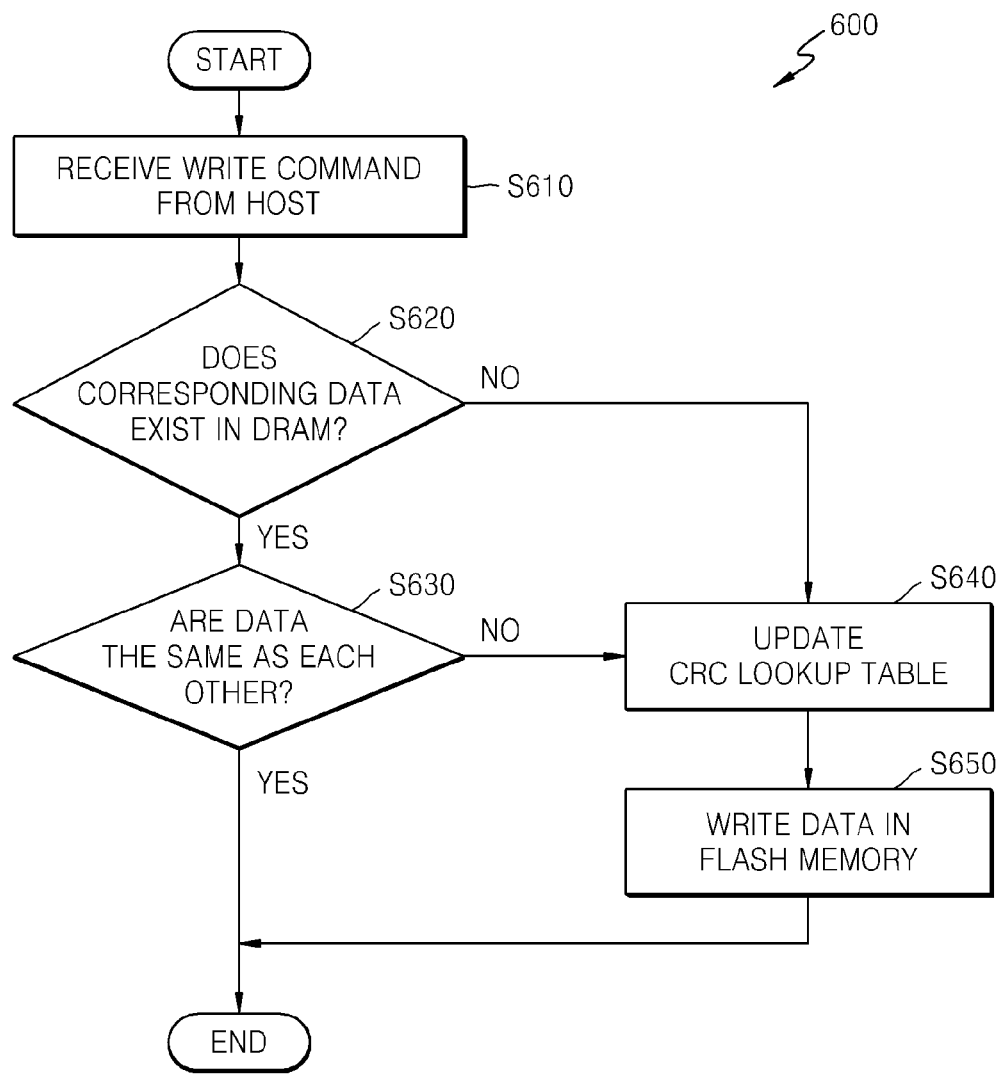
FIG. 6 is a flowchart summarizing a data storing method for the storage device of FIG. 1 according to still another embodiment of the inventive concept.

FIG. 6 is a flowchart summarizing a data storing method 600 for the storage device of FIG. 1 according to another embodiment of the present inventive concept.

Referring to FIGS. 1 and 6, according to the data storing method 600, a write command WCMD is received from the host (S610), and it is determined whether the LBA included in the write command WCMD exists in the DRAM 180 (S620), just as before with respect to the data storing method 400 of FIG. 4.

If the LBA does not exist in the DRAM 180 (S620=NO), the following operations are the same as those of the data storing method 400 illustrated in FIG. 4.

On the other hand, if the LBA included in the write command WCMD exists in the DRAM 180 (S620=YES), the operation of comparing the first CRC value with the second CRC value may be omitted unlike the data storing method 400 of FIG. 4, and then, the data included in the write command WCMD and the data stored in the cache memory 180 may be compared with each other (S630).

As described above, according to a storage device and a data storing method of the storage device of the inventive concept, the overall number of programming (or write) operations directed to the flash memory may be reduced, and the write endurance of the flash memory may be improved, accordingly. Therefore, the lifespan of the storage device including the flash memory may be increased, and the reliability of the storage device may be improved. The above-described embodiments may be variously selected and applied according to the specification of systems and user requirements.

Figure 7:
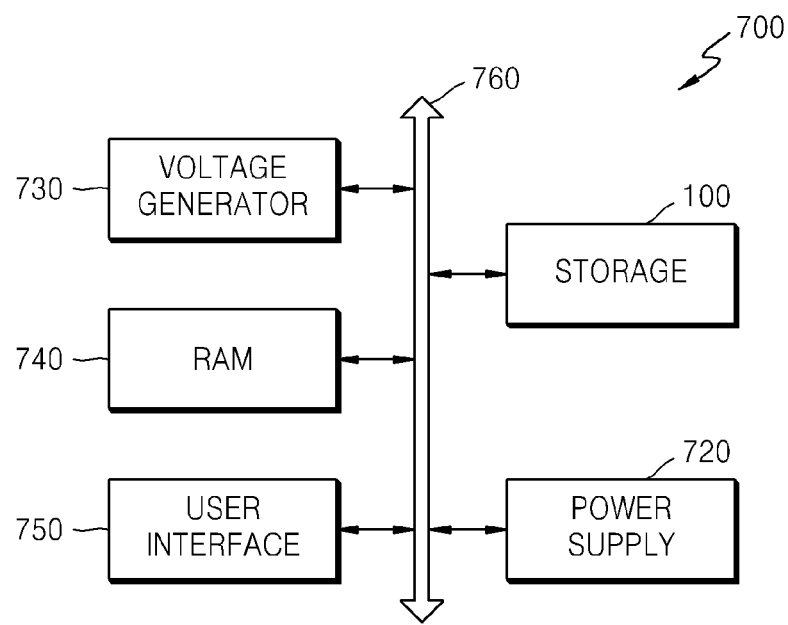
FIG. 7 is a block diagram of a computational system including the storage device of FIG. 1 according to an embodiment of the inventive concept.

FIG. 7 is a block diagram of a computational system 700 including the storage device 100 according to an embodiment of the inventive concept.

The computational system 700 generally comprises a microprocessor 730, a user interface 750, and a bus 760 electrically connected to the flash memory 160 of the storage device 100 is. The storage device 100 including the flash memory 160 may store N-bit data (N is an integer equal to 1 or greater) which is processed/will be processed by the microprocessor 730. The computational system 700 may further include a random access memory (RAM) 740 and a power supply 720.

When the computational system 700 is a mobile device, it may additionally comprise a battery applying power and modem, such as a baseband chipset. In addition, the computational system 700 may further comprise an application chipset (not shown), a camera image processor (CIS) (not shown), and a mobile DRAM (not shown), but detailed descriptions thereof will be omitted.

The flash memory included in the foregoing embodiments of the inventive concept may be variously mounted using various types of packages, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Certain embodiments of the inventive concept have been described as teaching example. The scope of the inventive concept is not limited to only the illustrated embodiments. For example, in the data storing method 200 of FIG. 2, if the LBA exists in the DRAM 180 (S220=YES), the operation of comparing the CRC values (S250) need not be performed.

While the inventive concept has been particularly shown and described with reference to exemplary embodiments thereof, it will be understood that various changes in form and details may be made therein without departing from the scope of the following claims.

What is claimed is:

1. A method of storing data in a storage device including a flash memory, the method comprising:
   receiving data which is to be stored in the flash memory and a logical block address (LBA) of the flash memory in which the data will be stored from a host;
   determining whether the LBA exists in a cache memory of the storage device;
   if the LBA exists in the cache memory of the storage device, comparing first error detection information corresponding to the data transmitted from the host with second error detection information of data corresponding to the LBA and stored in the cache memory;
   if the first error detection information and the second error detection information are the same as each other, comparing the data transmitted from the host with the data stored in the cache memory;

if the data transmitted from the host and the data stored in the cache memory are the same as each other, omitting an operation of storing the data transmitted from the host in the flash memory;

if the first error detection information and the second error detection information are not the same as each other or the data transmitted from the host and the data stored in the cache memory are not the same as each other, further comprising storing the data transmitted from the host in the flash memory.

2. The method of claim 1, if the LBA does not exist in the cache memory of the storage device, further comprising:

reading data corresponding to the LBA from the flash memory; and writing the data read from the flash memory in the cache memory.

3. The method of claim 1, if the LBA does not exist in the cache memory of the storage device, further comprising storing the data transmitted from the host in the flash memory.

4. The method of claim 1, wherein the first error detection information and second error detection information are generated by at least one selected from the group consisting of a cycle redundancy check (CRC) method, a parity method, and a checksum method.

5. The method of claim 1, wherein the storage device is a solid-state drive (SSD).

* * * * *